(12) United States Patent
Li et al.

(10) Patent No.: US 11,355,508 B2
(45) Date of Patent: Jun. 7, 2022

(54) DEVICES INCLUDING FLOATING VIAS AND RELATED SYSTEMS AND METHODS

(71) Applicant: Micron Technology, Inc., Boise, ID (US)

(72) Inventors: Hongqi Li, Boise, ID (US); James A. Cultra, Boise, ID (US); Sri Sai Sivakumar Vegunta, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/992,959

(22) Filed: Aug. 13, 2020

(65) Prior Publication Data

US 2022/0052061 A1  Feb. 17, 2022

(51) Int. Cl.
| | | |
|---|---|---|
| *G11C 11/00* | (2006.01) | |
| *H01L 27/11556* | (2017.01) | |
| *G11C 5/02* | (2006.01) | |
| *G11C 5/06* | (2006.01) | |
| *H01L 21/768* | (2006.01) | |
| *H01L 23/538* | (2006.01) | |
| *H01L 27/11582* | (2017.01) | |

(52) U.S. Cl.
CPC ........ *H01L 27/11556* (2013.01); *G11C 5/025* (2013.01); *G11C 5/06* (2013.01); *H01L 21/76802* (2013.01); *H01L 21/76877* (2013.01); *H01L 23/5384* (2013.01); *H01L 27/11582* (2013.01)

(58) Field of Classification Search
CPC ..... G11C 5/025; G11C 5/06; H01L 27/11556; H01L 21/76802; H01L 21/5384; H01L 27/11582
See application file for complete search history.

(56) References Cited

U.S. PATENT DOCUMENTS

| | | | | |
|---|---|---|---|---|
| 6,768,681 | B2* | 7/2004 | Kim ................. | H01L 29/40117 |
| | | | | 365/185.28 |
| 10,504,909 | B2* | 12/2019 | Vimercati ........... | G11C 11/2259 |
| 10,825,863 | B2* | 11/2020 | Redaelli ............. | G11C 13/0069 |
| 2020/0111530 | A1* | 4/2020 | Goda ................. | G11C 16/0408 |

* cited by examiner

*Primary Examiner* — Pho M Luu
(74) *Attorney, Agent, or Firm* — TraskBritt (57) ABSTRACT

A device has memory cells located within a cell deck of the device. The device includes functional vias within the cell deck, and one or more floating vias within the cell deck. The functional vias are electrically coupled to conductive structures of the device and the one or more floating vias have at least one end electrically isolated from the conductive structures of the device. Methods of forming a device may include forming memory cells in a cell deck, and forming floating vias in a dielectric material adjacent to the memory cells. An overlying mask material is removed from the dielectric material, and at least some memory cells are protected from mechanical damage during the removal of the overlying mask material with the floating vias. Electronic systems may include such devices.

25 Claims, 7 Drawing Sheets

DEVICES INCLUDING FLOATING VIAS AND RELATED SYSTEMS AND METHODS

TECHNICAL FIELD

Embodiments disclosed herein relate to the field of microelectronic device design and fabrication. More particularly, embodiments of the disclosure relate to devices including floating via structures, and to related systems and methods.

BACKGROUND

A continuing goal of integrated circuit fabrication is to increase integration density. For example, an increase in the density of memory cells within a memory device may facilitate the manufacture of smaller devices with larger memory capacities. This has been increasingly important for uses in mobile devices, such as smart phones. One technique utilized to increase the density of memory devices is to vertically stack memory cells in the device to form three-dimensional memory devices. While these techniques have been successful in increasing integration density, they have created many manufacturing challenges. For example, memory cells may be damaged during manufacturing, which may cause defects in the resulting devices. Accordingly, improvements in manufacturing methods that will prevent or reduce defects in the resulting devices are highly sought after.

DETAILED DESCRIPTION

Devices (e.g., a microelectronic device, a semiconductor device, a memory device, a computer system, a portable electronic device) are disclosed that include floating vias. The floating vias provide mechanical strength to a cell deck including the floating vias. Systems and methods related to such devices are also disclosed herein.

The following description provides specific details, such as material types and process conditions, in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a microelectronic device or a complete process flow for manufacturing the microelectronic device and the structures described below do not form a complete microelectronic device. Only those process acts and structures necessary to understand the embodiments described herein are described in detail below. Additional acts to form a complete microelectronic device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical polishing), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "underlying," "lower," "bottom," "above," "upper," "overlying," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" or "underlying" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., via another structure).

Figure 1:
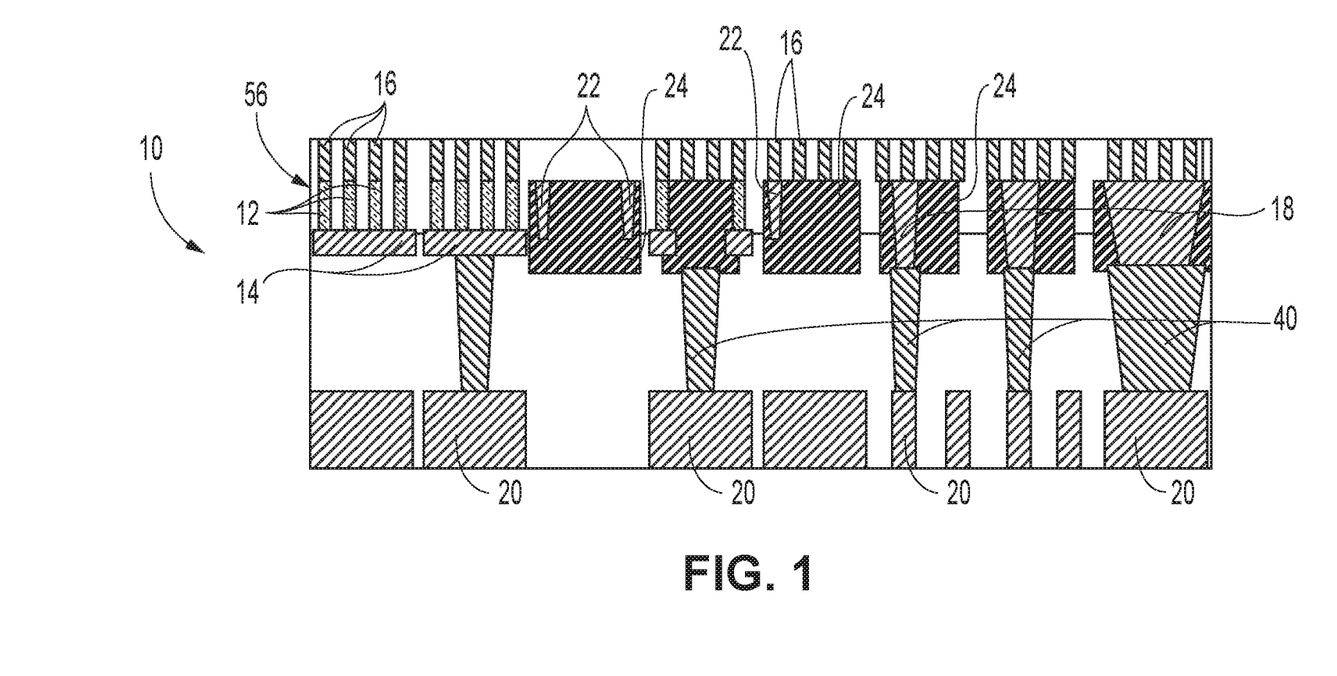
FIG. 1 is a cross-sectional view of a portion of a cell deck including floating vias according to embodiments of the disclosure.

FIG. 1 shows a cross-sectional view of a portion of a cell deck 10 which may be included in a device according to embodiments of the disclosure. For example, the cell deck 10 may be combined with other cell decks in a vertical stack to provide a high-density memory device. The cell deck 10 may include memory cells 12 formed therein for the electronic storage and retrieval of data. Each memory cell 12 may be positioned between and coupled to (e.g., electrically coupled to) conductive structures, such as access lines (e.g., word lines 14) and digit lines (e.g., bit lines 16). The word lines 14 and the bit lines 16 may be configured as a bottom electrode and a top electrode, respectively, to each memory cell 12.

The cell deck 10 may additionally include vias (e.g., conductive vias) to electrically interconnect and couple various structures (e.g., components) of the device. Such vias will be referred to herein as so-called "functional vias" (e.g., active vias). For example, multiple functional vias 18 may electrically couple the bit lines 16 and word lines 14 to underlying complementary metal-oxide-semiconductor (CMOS) circuitry or other conductive structures of a memory device. Each functional via 18 may have an end in electrical connection with, either directly or indirectly, metal structures (e.g., metal lines, metal contacts 20). For example, the functional vias 18 may be utilized for the delivery of read and/or write signals to and/or from CMOS circuitry and each memory cell 12. The cell deck 10 may include multiple levels (e.g., wiring levels), with each level including one or more conductive structures configured to electrically couple the functional vias 18 to other conductive structures of the device.

At least one via may be included within the cell deck 10 that does not provide an electrical path in the device, or at least do not provide a functional electrical path in the device. Such vias will be referred to herein as so-called "floating vias" (e.g., dummy vias). For example, each floating via 22 may include at least one end that is surrounded by a dielectric material 24 such that each floating via 22 does not extend through the dielectric material 24 to any conductive structures, such as the underlying metal contacts 20. The dielectric material 24 may isolate (e.g., electrically isolate) the floating via 22 from other conductive structures. For a non-limiting example, the dielectric material 24 surrounding an end of each floating via may be comprised of a dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), a dielectric nitride material (e.g., $SiN_y$), a dielectric oxynitride material (e.g., $SiO_xN_y$), a dielectric oxycarbide material (e.g., $SiO_xC_z$), a dielectric carboxynitride material (e.g., $SiO_xC_zN_y$), and/or amorphous carbon. The floating vias 22 may provide protection and mechanical support to the memory cells 12 during the manufacturing process, as will be discussed in more detail below. The floating vias 22, however, do not couple any electrically conductive component to any other electrically conductive component of the device and do not substantially contribute to the electrical functioning of the device. By including the floating vias 22 in the cell deck 10, a total number of vias in the cell deck 10 may be similar to the total number of vias in adjacent (e.g., underlying) cell decks (not shown). Therefore, mismatch between cell decks of a stack of cell decks is minimized.

The functional vias 18 and the floating vias 22 may be comprised of the same material. As a non-limiting example, the functional vias 18 and the floating vias 22 may be comprised of a conductive material, such as a metal (e.g., tungsten, titanium, nickel, platinum, rhodium, ruthenium, iridium, aluminum, copper, molybdenum, silver, gold), a metal alloy, a metal-containing material (e.g., metal nitrides, metal silicides, metal carbides, metal oxides), alloys thereof, other materials exhibiting electrical conductivity, or combinations thereof.

Figure 2:
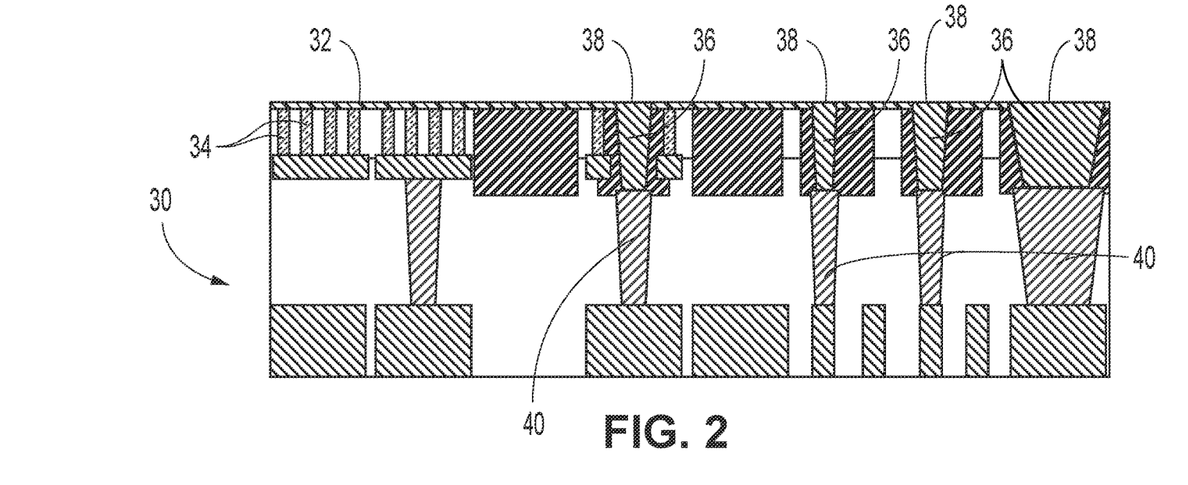
FIG. 2 is a cross-sectional view of a portion of another cell deck that does not include (e.g., lacks) floating vias and includes a mask material.

FIG. 2 shows a cross-sectional view of a portion of a cell deck 30 lacking any floating vias 22 and at a prior stage in the manufacturing process relative to the cell deck 10 depicted in FIG. 1. A mask material 32 may be formed over memory cells 34 to facilitate the formation of functional vias 36. With the assistance of a reticle, apertures 38 may be defined in the mask material 32 with desired sizes and at desired locations. The cell deck 30 may be exposed to an etchant and the apertures 38 in the mask material 32 may facilitate the selective removal of material to produce openings extending from the surface exposed to the etchant by the apertures 38 in the mask material 32 to underlying metal structures, such as underlying functional vias 40, which may act as an etch stop. A metal, such as tungsten, may then be formed (e.g., deposited) within the openings to form the functional vias 36.

Figure 3:
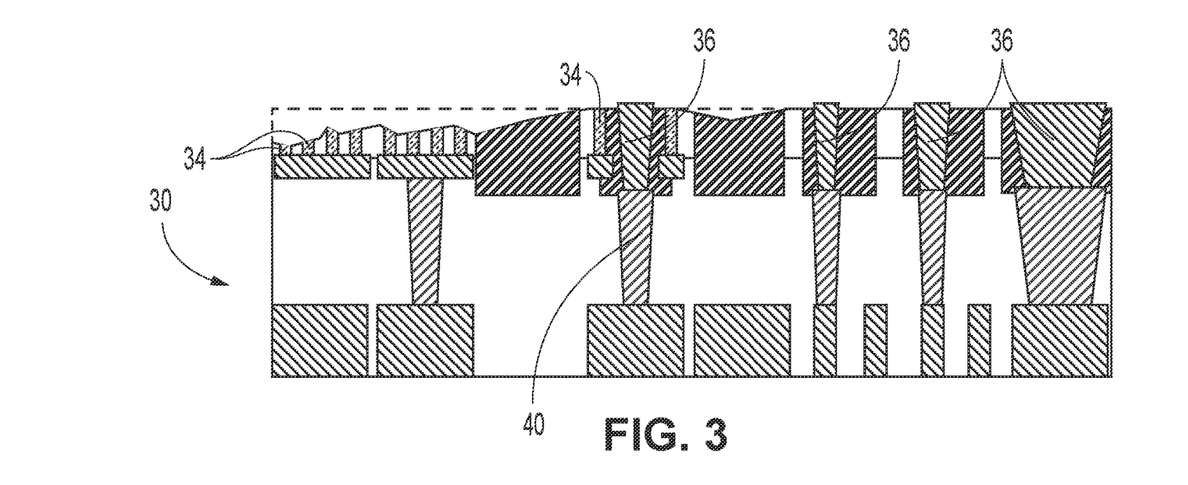
FIG. 3 is a cross-sectional view of the cell deck of FIG. 2 with the mask material removed.

As shown in FIG. 3, after the functional vias 36 have been formed, the mask material 32 may be removed by, for example, a chemical-mechanical polishing (CMP) process. The CMP process may damage memory cells 34, especially memory cells 34 at a location that is distant from any of the functional vias 36. This damage may result in the cell deck 30 having non-functional memory cells 34 and the cell deck 30 may have reduced functionality and/or may be unusable. Memory cells 34 that are located in a region proximate to the functional vias 36 may survive the CMP process without significant damage, as the functional vias 36 may protect the memory cells 34 proximate thereto. However, cell decks that include regions of memory cells 34 that are distant from any functional vias 36 may suffer significant damage to memory cells 34 in such distant regions.

Figure 4:
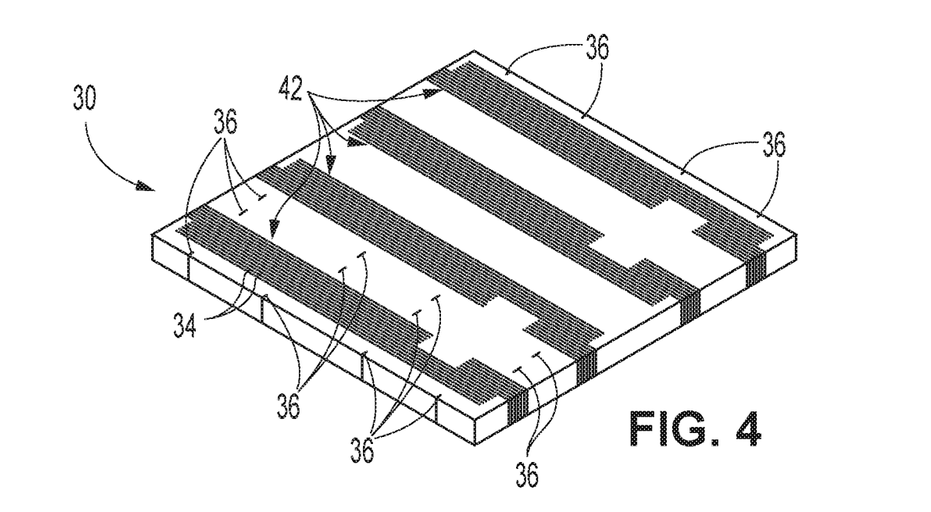
FIG. 4 is an isometric view of the cell deck of FIG. 2 wherein memory cells are exposed and visible at the top surface.

FIG. 4 shows an isometric view of the cell deck 30, wherein the memory cells 34 are exposed and visible at the top surface. The cell deck 30 may be configured with functional vias 36 and arrays 42 of the memory cells 34. The cell deck 30 may include relatively few functional vias 36 relative to underlying cell decks (not shown), as the cell deck 30 may be configured to be positioned at or near the top of a stack of cell decks in a memory device. Each cell deck of a stack of cell decks may include similar arrays 42 of memory cells 34, such that each cell deck may have substantially the same performance. Cell decks that are near the bottom of the stack of cell decks may include a relatively large number of functional vias 36 therein to facilitate electrical communication between the underlying CMOS and the memory cells 34 of each of the overlying cell decks, as well as within the cell deck itself. On the other hand, cell decks near the top of the stack of cell decks, such as the cell deck 30 shown in FIG. 4, may include relatively few functional vias 36 therein relative to the underlying decks.

As a result of the cell decks located at or near the top of the stack of cell decks having relatively few functional vias 36 (e.g., a low via density), the damage to memory cells 34 resulting from CMP removal of an overlying mask during manufacturing may be particularly severe.

Figure 5:
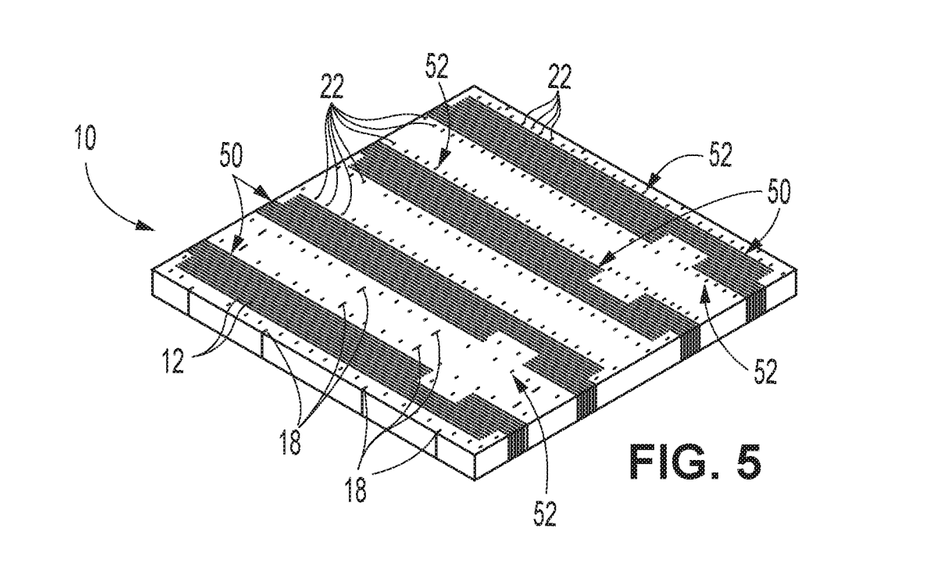
FIG. 5 is an isometric view of the cell deck of FIG. 1 wherein memory cells are exposed and visible at the top surface.

FIG. 5 shows an isometric view of the cell deck 10 according to embodiments of the disclosure, wherein the memory cells 12 are exposed and visible at the top surface. Similarly to cell deck 30, cell deck 10 may be configured to be positioned at or near the top of a stack of cell decks in a memory device. One or more additional cell decks (not shown) may be adjacent to (e.g., below) the cell deck 10. The cell deck 10 may be configured to include an arrangement of the functional vias 18 and arrays 50 of the memory cells 12 similar to the arrangement of the functional vias 36 and arrays 42 of the memory cells 34 of the cell deck 30. Adjacent arrays 50 of the memory cells 12 are separated from one another by the dielectric material 24. The cell deck 10, however, additionally includes the floating vias 22, which increase the via density of the cell deck 10 and protect the memory cells 12 from damage during processing, such as during the CMP removal of an overlying mask. The floating vias 22 are substantially evenly distributed throughout the cell deck 10, increasing the total via density of the cell deck 10. While FIG. 5 illustrates a specific configuration of the floating vias 22, other configurations of the floating vias 22 in the dielectric material 24 may provide the desired mechanical strength and mechanical support to the cell deck 10.

The locations of the floating vias 22 may be selected to maximize an extent (e.g., degree) of protection of the memory cells 12 in the cell deck 10. The floating vias 22 may be arranged in one or more arrangement 52. Some of the floating vias 22 may be arranged and distributed along edges of the arrays 50 of the memory cells 12, and some of the floating vias 22 may be arranged and distributed around corners of the arrays 50 of the memory cells 12. For example, the floating vias 22 may be arranged around a perimeter of the memory cells 12. Additionally, the locations of the functional vias 18 may be considered and the locations of the floating vias 22 may be selected to provide a relatively evenly distributed via density throughout the cell deck 10.

Figure 6:
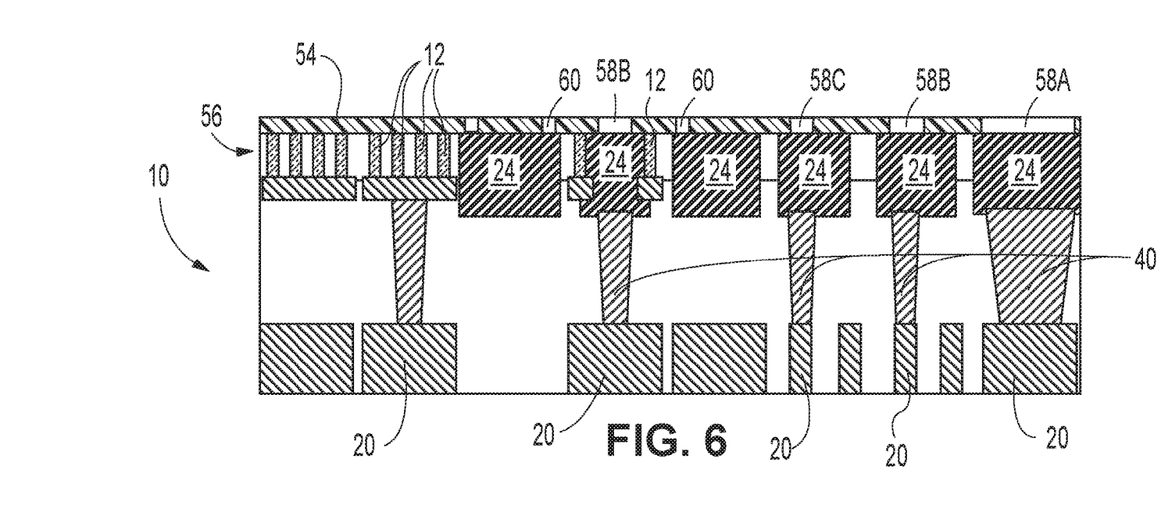
FIG. 6 is a cross-sectional view of the portion of the cell deck of FIG. 1 at an earlier stage in the manufacturing process, prior to the formation of the floating vias, that includes a mask material.

FIG. 6 shows a cross-sectional view of the portion of the cell deck 10 shown in FIG. 1 at an earlier stage in the manufacturing process, prior to the formation of the functional vias 18 or the floating vias 22. A mask material 54 may be formed over a dielectric material 56 containing the memory cells 12 to facilitate the formation of the functional vias 18 and the floating vias 22. The initial stage shown in FIG. 6 includes multiple levels including the word lines 14, the memory cells 12, the dielectric material 56, and the dielectric material 24, which may be formed by conventional techniques. Apertures 58 (collectively referring to apertures 58A, 58B, and 58C), 60 may be defined in the mask material 54 with desired sizes and at desired locations by conventional photolithography techniques using a reticle (not shown) having correspondingly-sized openings. The apertures 60 may exhibit a smaller diameter than the diameter of the apertures 58. The apertures 60 may be similarly sized as one another or may be differently sized. The apertures 58 may exhibit a larger diameter than the diameter of the apertures 60. The apertures 58 may be similarly sized as one another or may be differently sized. As shown in FIG. 6, the apertures 58 may include apertures 58A, 58B, 58C, with apertures 58A exhibiting a larger diameter than apertures 58B and apertures 58B exhibiting a larger diameter than apertures 58C. The size of the apertures 58, 60 corresponds to the size of the functional vias 18, floating vias 22 ultimately to be formed in the cell deck 10.

Figure 7:
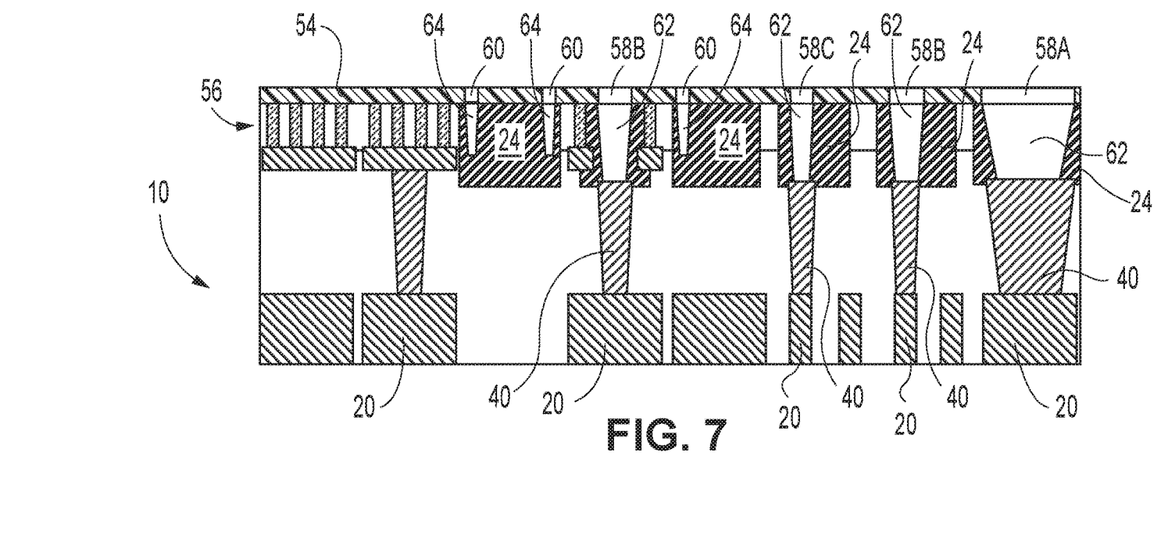
FIG. 7 is a cross-sectional view of the portion of the cell deck of FIG. 6 after an etching process.

As illustrated in FIG. 7, an etchant may then be applied and the apertures 58, 60 in the mask material 54 used to facilitate the selective removal of the dielectric material 24 to produce openings 62, 64 extending from an upper surface of the dielectric material 24 and into the dielectric material 24. For dielectric material 24 underlying relatively large apertures 58 in the mask material 54, the underlying dielectric material 24 may be removed to form an opening 62 extending from the upper surface of the dielectric material 24 to underlying metal structures, such as underlying functional vias 40. The functional vias 40 may act as an etch stop to removing the dielectric material 24. For material underlying smaller apertures 60 in the mask material, less underlying dielectric material 24 may be removed in the same amount of time of exposure to the etchant relative to the amount of removed dielectric material 24 underlying the relatively large apertures 58. Accordingly, for the smaller apertures 60, the etchant may remove the dielectric material 24 to form shorter openings 64 extending from the upper surface of the dielectric material 24 and into the underlying dielectric material 24. However, the shorter openings 64 do not extend through the dielectric material 24. Therefore, the shorter openings 64 may not extend to any underlying conductive structures, such as metal structures. The size of the apertures 58, 60 substantially corresponds to the size of the openings 62, 64 formed in the dielectric material 24.

Figure 8:
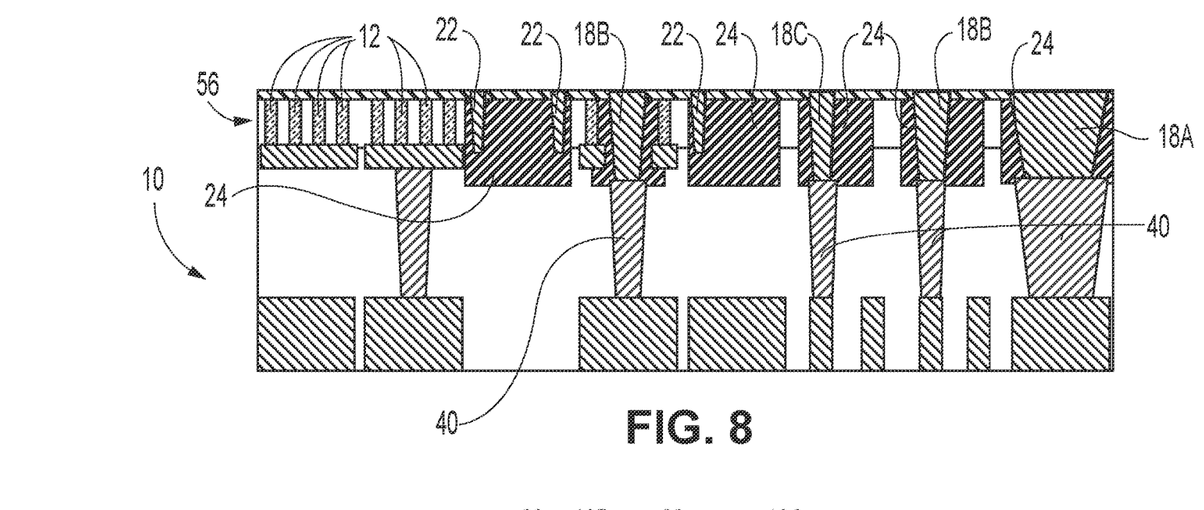
FIG. 8 is a cross-sectional view of the portion of the cell deck of FIG. 7 after the formation of the floating vias and including the mask material.

As shown in FIG. 8, a conductive material, such as tungsten, titanium, nickel, platinum, rhodium, ruthenium, iridium, aluminum, copper, molybdenum, silver, gold, a metal alloy, and/or a metal-containing material (e.g., metal nitrides, metal silicides, metal carbides, metal oxides) may then be formed (e.g., deposited) within the openings 62 to form the functional vias 18 within the openings 62, the functional vias 18 extending to the underlying functional vias 40. Additionally, the conductive material may be simultaneously formed within the shorter openings 64 to form the floating vias 22 within the shorter openings 64, the floating vias 22 extending into the dielectric material 24. The floating vias 22 may be separated from other conductive materials by the dielectric material 24. The size of the openings 62, 64 in the dielectric material 24 substantially corresponds to the size of the functional vias 18 and floating vias 22 formed in the dielectric material 24. As shown in FIG. 8, the functional vias 18 include functional vias 18A, 18B, 18C, with the functional vias 18A exhibiting a larger diameter than functional vias 18B and functional vias 18B exhibiting a larger diameter than functional vias 18C. The floating vias 22 may exhibit a smaller diameter than the functional vias 18A, 18B, 18C.

Figure 9:
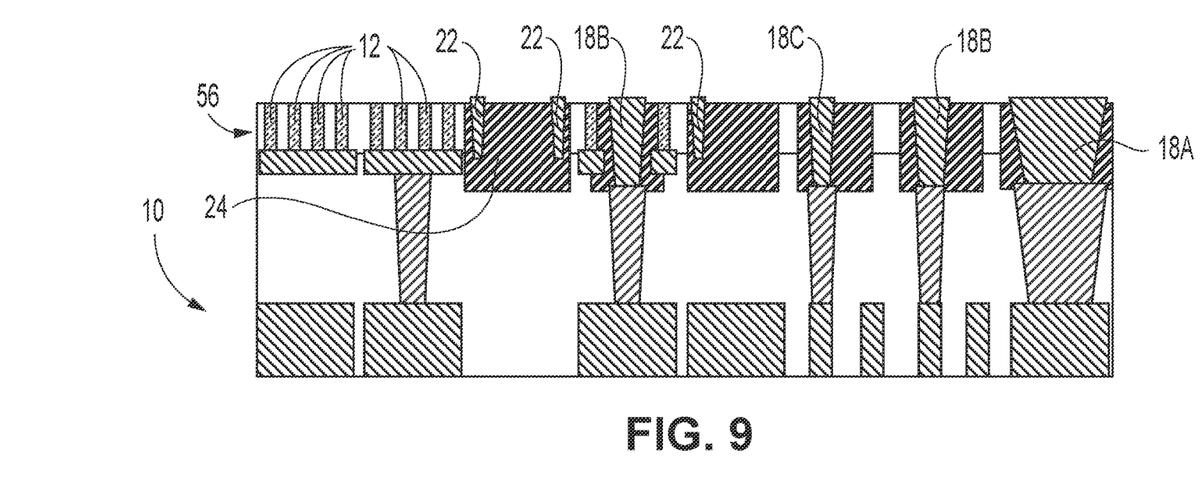
FIG. 9 is a cross-sectional view of the portion of the cell deck of FIG. 8 after the mask material is removed.

After formation of the functional vias 18 and the floating vias 22 the mask material 54 may be removed, as shown in FIG. 9, using a CMP process. As the functional vias 18 and the floating vias 22 are comprised of a conductive material (e.g., a metal such as tungsten) that is more resistant to removal by the CMP process, as compared to the surrounding materials in the dielectric material 56, a portion 68 of the functional vias 18 and the floating vias 22 may protrude above the surrounding dielectric material 24, as shown in a detailed cross-sectional view in FIG. 10.

Figure 10:
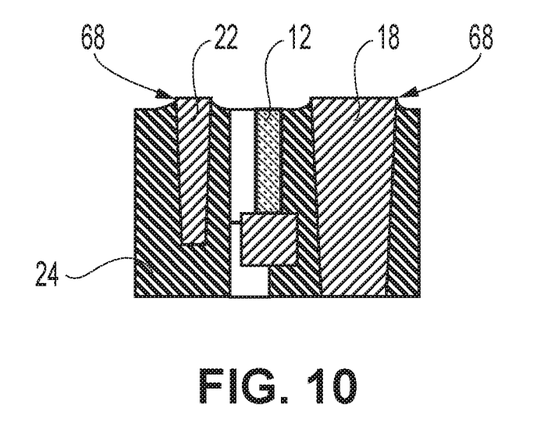
FIG. 10 is a cross-sectional detail view of the portion of the cell deck of FIG. 9, showing a protruding portion of a floating via.

The portion 68 of the functional vias 18 and the floating vias 22 protruding over the dielectric material 24 may protect proximal memory cells 12 from damage during the CMP process. While the locations of the functional vias 18 may be determined based on locations where electrical connection is needed, the locations of the floating vias 22 may be selected specifically to provide protection to the memory cells 12 that may be susceptible to damage. For example, the floating vias 22 may be provided in an arrangement 52, spaced along the edges of the arrays 50 of the memory cells 12, such as shown in FIG. 5.

Referring again to FIG. 1, after the mask material 54 is removed, an additional portion of the dielectric material 56 may be formed over the memory cells 12, the functional vias 18, and the floating vias 22. The dielectric material 56 may be patterned by conventional techniques and a conductive material formed in the resulting openings to form the bit lines 16 adjacent to the memory cells 12 and the functional vias 18 and provide an electrical connection thereto. Optionally, a bit line 16 may contact a floating via 22. As the floating via 22 is electrically isolated at the other end, such as by the dielectric material 24, the floating via 22 does not provide an electrical connection between the bit line 16 and any other electrically conductive component of the device. Accordingly, the floating vias 22 may be in contact with an electrically conductive component at one end, such as the bit line 16, so long as the floating via 22 does not contact any electrically conductive component at the other end, such that no electric circuit is provided by the floating via 22. In other words, the floating vias 22 may be in contact with a conductive material at only one of its opposing ends. While not illustrated in FIG. 1, the floating via 22 may optionally be in contact with a contact (e.g., a dummy contact, a floating contact) that is not electrically connected to other conductive structures, depending on process acts conducted during the fabrication of the device.

It may be possible to produce the floating vias 22 using various other techniques. For example, the floating vias 22 may be formed in the dielectric material 24 using separate mask and etching acts from those utilized to form the functional vias 18, which may allow more flexibility in the size of the floating vias 22. For another example, since conductivity of the floating vias 22 is not needed, the floating vias 22 may be formed from any material exhibiting sufficient mechanical strength to protect the adjacent memory cells 12 during manufacturing. For example, the shorter openings 64 may be filled with a non-conductive material. Such variations may provide additional flexibility in the configuration and placement of the floating vias 22, but may add additional cost and complexity to the manufacturing process relative to the methods described above with reference to FIGS. 6-9.

By forming the floating vias 22 substantially simultaneous to the formation of the functional vias 18, the floating vias 22 may be incorporated into the device without additional manufacturing acts and no significant increase in the cost and complexity of manufacturing. The floating vias 22 may be added by simply changing a reticle used to form the apertures 58, 60 in the mask material 54. Therefore, the floating vias 22 may be formed without significantly increasing the cost or complexity of the manufacturing process.

Figure 11:
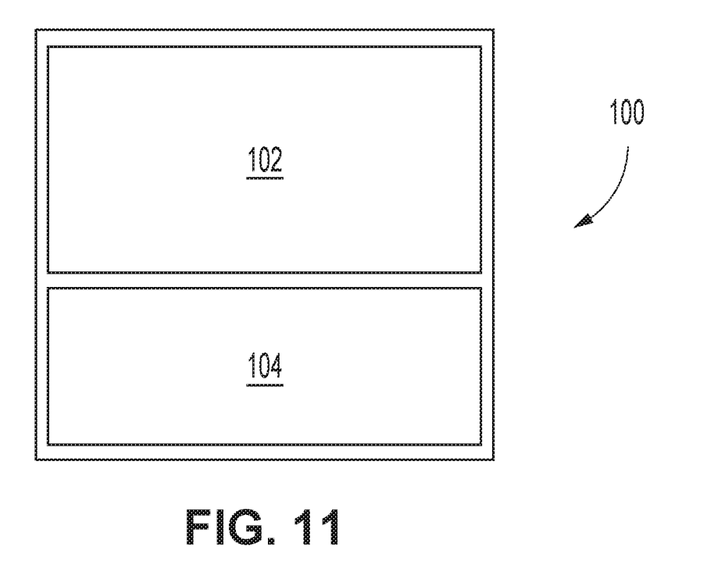
FIG. 11 is a schematic block diagram illustrating a microelectronic device with at least one cell deck including floating vias, according to embodiments of the disclosure.

FIG. 11 shows a block diagram of a microelectronic device 100 (e.g., a 3D memory device, a crosspoint memory device) including one or more cell decks 10 including floating vias 22 according to embodiments of the disclosure. The microelectronic device 100 may include at least one cell deck 102 such as, for example, multiple cell decks. The at least one cell deck 102 may be configured like the cell deck 10 described with reference to FIGS. 1 and 5-10. The at least one cell deck 102 may include at least one memory cell array, such as the array 50 of memory cells 12, and the floating vias 22.

The microelectronic device 100 may further include a CMOS region 104 underlying the at least one cell deck 102 that inputs and/or outputs data to and/or from outside the microelectronic device 100, thus providing access to the at least one cell deck 102. The CMOS region 104 may communicate electrically with the memory cells that are connected to word lines and bit lines of the at least one cell deck 102. Further, the CMOS region 104 may underlie the at least one cell deck 102 and include support circuitry thereof. The support circuitry may support one or more additional cell decks present in a stacked configuration. For example, the microelectronic device 100, including the at least one cell deck 102, can be two-dimensional, exhibiting a single cell deck (e.g., a single tier, a single level), or can be three-dimensional, exhibiting multiple cell decks (e.g., multiple levels, multiple tiers). In a stacked configuration, the CMOS region 104 may facilitate accessing one or more memory cells in each cell deck. By way of example only, the microelectronic device 100 may be a crosspoint memory device that includes the memory cells 12, functional vias 18, floating vias 22, word lines 14, and bit lines 16 as described above. However, the microelectronic device 100 may be another 3D electronic device, such as a 3D NAND device, a Flash memory device, or other memory device in which the floating vias 22 in the cell deck 10 as described above would be desirable.

Figure 12:
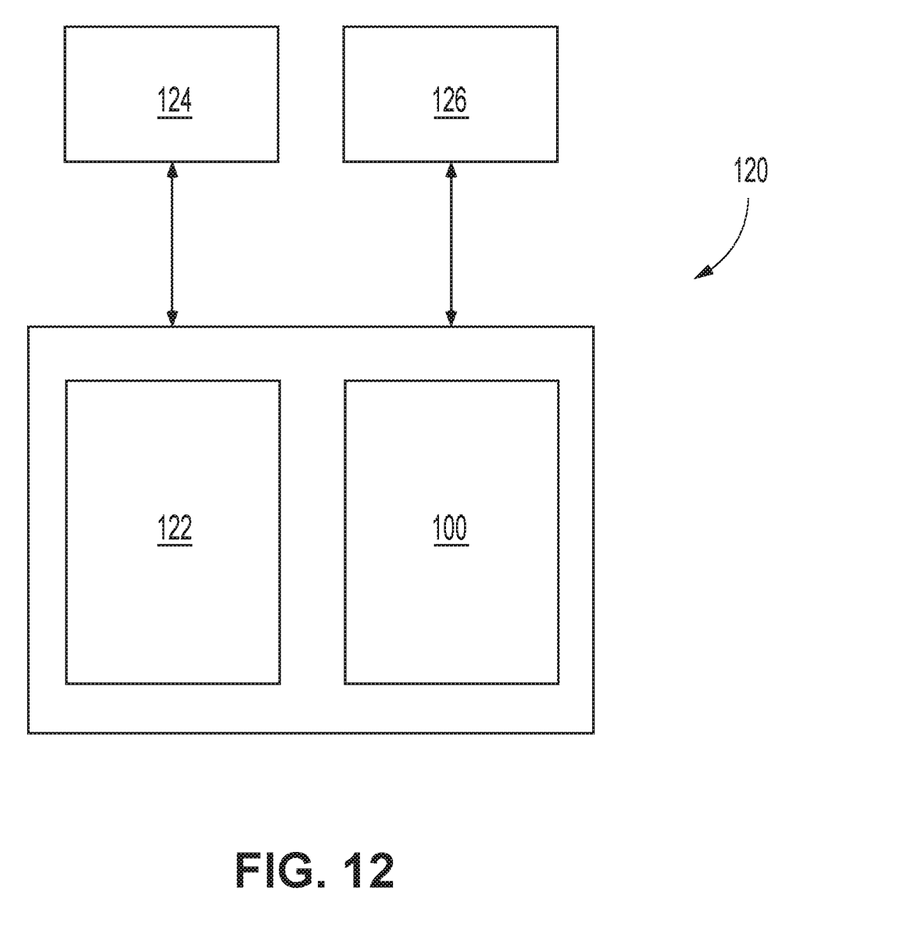
FIG. 12 is a schematic block diagram illustrating an electronic system including at least one microelectronic device of FIG. 11, in accordance with embodiments of the disclosure.

FIG. 12 is a block diagram of an electronic system 120 including at least one microelectronic device 100 according to embodiments of the disclosure. The electronic system 120 may comprise, for example, a computer or computer hardware component, a server or other networking hardware component, a cellular telephone, a digital camera, a personal digital assistant (PDA), portable media (e.g., audio and/or video) player, a Wi-Fi or cellular-enabled tablet, an electronic book, a navigation device, etc. The electronic system 120 includes at least one microelectronic device 100. The electronic system 120 may further include at least one electronic signal processor device 122 (often referred to as a "microprocessor"). The electronic system 120 may further include one or more input device 124 for inputting information into the electronic system 120 by a user, such as, for example, a mouse or other pointing device, a keyboard, a touchpad, a button, and/or a control panel. The electronic system 120 may further include one or more output device 126 for outputting information (e.g., visual or audio output) to a user such as, for example, a monitor, a display, a printer, an audio output jack, a speaker, etc. In some embodiments, the input device 124 and the output device 126 may comprise a single touchscreen device that can be used both to input information to the electronic system 120 and to output visual information to a user. The input device 124 and the output device 126 may communicate electrically with one or more of the microelectronic device 100 and the electronic signal processor device 122.

Accordingly, a device is disclosed, the device having memory cells located within a cell deck of the device. The device includes functional vias within the cell deck, and one or more floating vias within the cell deck. The functional vias are electrically coupled to conductive structures of the device and the one or more floating vias have at least one end electrically isolated from the conductive structures of the device.

Accordingly, a method of forming a device is disclosed. The method comprises forming memory cells in a cell deck, and forming floating vias in a dielectric material adjacent to the memory cells. An overlying mask material is removed from the dielectric material, and at least some memory cells are protected from mechanical damage during the removal of the overlying mask material with the floating vias.

Accordingly, another method of forming a device is disclosed. The method comprises forming memory cells in a cell deck, the memory cells electrically coupled to word lines. Openings are formed in a dielectric material adjacent to the memory cells, the openings extending at least partially into the dielectric material. A conductive material is formed in the openings to form functional vias and floating vias. The functional vias are electrically coupled to conductive structures in the device and the floating vias are isolated from the conductive structures. Bit lines are formed adjacent to the memory cells, and the bit lines are electrically coupled to the memory cells.

Accordingly, an electronic system is disclosed. The electronic system comprises at least one input device, at least one output device, and at least one processor device operably coupled to the at least one input device and the at least one output device. A memory device is operably coupled to the at least one processor device. The memory device comprises memory cells, functional vias, and floating vias within a cell deck. The floating vias are proximal to the memory cells and the functional vias are adjacent to the floating vias. Word lines and bit lines are electrically coupled to the memory cells. The word lines are electrically coupled to conductive structures of the memory device. Additional bit lines are electrically coupled to the functional vias, and the functional vias are coupled to additional conductive structures of the memory device.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A device, comprising:
   memory cells located within a cell deck of a device;
   functional vias within the cell deck; and
   one or more floating vias within the cell deck,
   the functional vias electrically coupled to conductive structures of the device and the one or more floating vias having at least one end electrically isolated from the conductive structures of the device, wherein the one or more floating vias do not electrically couple any electrically conductive component of the device to another electrically conductive component of the device.

2. The device of claim 1, wherein the one or more floating vias comprises multiple floating vias.

3. The device of claim 2, wherein the multiple floating vias are arranged around a perimeter of the memory cells.

4. The device of claim 2, wherein a diameter of each of the floating vias is smaller than a diameter of the functional vias.

5. The device of claim 2, wherein each of the floating vias comprises a metal material.

6. The device of claim 5, wherein each of the floating vias comprises a same metal material as the functional vias.

7. The device of claim 2, wherein the at least one end of each of the floating vias is surrounded by a dielectric material.

8. The device of claim 2, wherein a depth of each of the floating vias is smaller than a depth of the functional vias.

9. The device of claim 2, wherein the memory cells are arranged in arrays wherein at least some floating vias are positioned along edges of the arrays.

10. The device of claim 9, wherein at least some of the floating vias are positioned around corners of the arrays.

11. The device of claim 1, wherein at least some of the floating vias are completely surrounded by a dielectric material.

12. The device of claim 1, further comprising:
    word lines electrically coupled to the memory cells; and
    bit lines electrically coupled to the memory cells and in contact with some of the floating vias.

13. The device of claim 2, further comprising:
    additional memory cells located within another cell deck of the device; and
    additional floating vias located within the another cell deck, the another cell deck adjacent to the cell deck.

14. A method of forming a device, comprising:
    forming memory cells in a cell deck;
    forming floating vias in a dielectric material adjacent to the memory cells;
    removing an overlying mask material from the dielectric material; and
    protecting at least some memory cells from mechanical damage during the removal of the overlying mask material with the floating vias.

15. The method of claim 14, wherein removing the overlying mask material comprises chemical-mechanical polishing.

16. The method of claim 14, further comprising forming functional vias in the dielectric material.

17. The method of claim 16, wherein forming functional vias in the dielectric material comprises substantially simultaneously forming openings in the dielectric material for the formation of both the floating vias and the functional vias.

18. The method of claim 17, further comprising substantially simultaneously forming a conductive material in the openings to form both the floating vias and the functional vias.

19. The method of claim 18, further comprising forming the floating vias to have a diameter smaller than a diameter of the functional vias.

20. A method of forming a device, comprising:
forming memory cells in a cell deck, the memory cells electrically coupled to word lines;
forming openings in a dielectric material adjacent to the memory cells, the openings extending at least partially into the dielectric material;
forming a conductive material in the openings to form functional vias and floating vias, the functional vias electrically coupled to conductive structures in the device and the floating vias isolated from the conductive structures; and
forming bit lines adjacent to the memory cells, the bit lines electrically coupled to the memory cells.

21. The method of claim 20, wherein forming openings in a dielectric material adjacent to the memory cells comprises forming some of the openings extending through the dielectric material and others of the openings extending partially into the dielectric material.

22. The method of claim 21, wherein forming a conductive material in the openings comprises forming the functional vias extending through the dielectric material and forming the floating vias extending partially into the dielectric material.

23. The method of claim 21, wherein forming bit lines adjacent to the memory cells comprises forming the bit lines adjacent to some of the floating vias.

24. An electronic system, comprising:
at least one input device;
at least one output device;
at least one processor device operably coupled to the at least one input device and the at least one output device; and
a memory device operably coupled to the at least one processor device, the memory device comprising:
memory cells, functional vias, and floating vias within a cell deck, the floating vias proximal to the memory cells and the functional vias adjacent to the floating vias;
word lines and bit lines electrically coupled to the memory cells, the word lines electrically coupled to conductive structures of the memory device; and
additional hit lines electrically coupled to the functional vias, the functional vias coupled to additional conductive structures of the memory device.

25. The system of claim 24, wherein the floating vias are electrically isolated from the conductive structures and the additional conductive structures.

* * * * *

UNITED STATES PATENT AND TRADEMARK OFFICE
CERTIFICATE OF CORRECTION

PATENT NO. : 11,355,508 B2
APPLICATION NO. : 16/992959
DATED : June 7, 2022
INVENTOR(S) : Hongqi Li, James A. Cultra and Sri Sai Sivakumar Vegunta It is certified that error appears in the above-identified patent and that said Letters Patent is hereby corrected as shown below:

In the Claims

Claim 24, Column 12, Line 22, change "additional hit lines" to --additional bit lines--

Signed and Sealed this
Twenty-seventh Day of August, 2024

Katherine Kelly Vidal
*Director of the United States Patent and Trademark Office*